United States Patent
Salvador et al.

(10) Patent No.: US 11,774,514 B2
(45) Date of Patent: Oct. 3, 2023

(54) ELECTROCHEMICAL METHODS FOR IDENTIFICATION OF CELL QUALITY

(71) Applicant: GM Global Technology Operations LLC, Detroit, MI (US)

(72) Inventors: James R. Salvador, East Lansing, MI (US); Thomas A. Yersak, Royal Oak, MI (US); Debejyo Chakraborty, Novi, MI (US); Charles W. Wampler, Birmingham, MI (US); Thanh-Son Dao, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 20 days.

(21) Appl. No.: 17/350,620

(22) Filed: Jun. 17, 2021

(65) Prior Publication Data

US 2022/0404430 A1 Dec. 22, 2022

(51) Int. Cl.
| | |
|---|---|
| *G01R 31/396* | (2019.01) |
| *H01M 4/04* | (2006.01) |
| *G01R 31/367* | (2019.01) |
| *H01M 10/48* | (2006.01) |
| *H01M 10/44* | (2006.01) |

(52) U.S. Cl.
CPC ......... *G01R 31/396* (2019.01); *G01R 31/367* (2019.01); *H01M 4/0447* (2013.01); *H01M 10/441* (2013.01); *H01M 10/446* (2013.01); *H01M 10/482* (2013.01)

(58) Field of Classification Search
CPC .......... C12N 9/00; C12N 9/1051; C12N 9/90; C12N 9/92; C12P 19/02; C12Y 204/01001; C12Y 204/01007; C12Y 204/01025; C12Y 504/02002
See application file for complete search history.

(56) References Cited

U.S. PATENT DOCUMENTS

| | | | |
|---|---|---|---|
| 2011/0043212 A1* | 2/2011 | Kirchev | H01M 10/486 324/427 |
| 2011/0128006 A1* | 6/2011 | Ren | G01R 31/392 324/426 |
| 2011/0213509 A1* | 9/2011 | Onnerud | H01M 10/482 700/297 |
| 2011/0239445 A1* | 10/2011 | Ibi | H01M 50/204 29/623.1 |
| 2013/0204561 A1* | 8/2013 | Daiss | G01R 31/382 702/63 |
| 2014/0266060 A1* | 9/2014 | Ying | H02J 7/0048 320/134 |
| 2020/0044280 A1* | 2/2020 | Modeki | H01M 10/00 |
| 2020/0292622 A1* | 9/2020 | Wu | H01M 10/4285 |
| 2020/0358147 A1* | 11/2020 | Dou | G01N 29/024 |
| 2021/0257840 A1* | 8/2021 | Fauteux | H01M 10/06 |

* cited by examiner

*Primary Examiner* — Kyle R Quigley
(74) *Attorney, Agent, or Firm* — Vivacqua Crane PLLC (57) ABSTRACT

A method for identifying a cell quality during cell formation includes: conducting a beginning of life cycling following an initial cell formation charge of multiple cells; collecting and preprocessing a discharge data set generated by one of the multiple cells during the beginning of life cycling; calculating a statistical variance from the discharge data set identifying an estimated probability of meeting a target cell usage time; and projecting a life span of the multiple cells.

7 Claims, 8 Drawing Sheets

ELECTROCHEMICAL METHODS FOR IDENTIFICATION OF CELL QUALITY

INTRODUCTION

The present disclosure relates to battery cell manufacture.

Cell manufacturing methods and processes for production of battery cells of automobile vehicle battery packs commonly include several test and hold steps or practices. These include a first practice conducted during cell formation which defines a discharge capacity check to identify if the cell provides a predetermined ampere-hour (Ah) capacity. The measured Ah capacity must meet or exceed a specified value. Cells that fail this first practice or step are commonly set aside or discarded.

A second practice places individual cells in an inventory hold for a hold period of at least 7 to 10 days and up to several months during which time cell open circuit voltage monitoring is conducted. Cell open circuit voltage is monitored during the inventory hold period to identify if cell "voltage droop" occurs, which is defined as a gradual decrease of the open circuit voltage over time. A cell displaying a voltage droop exceeding a predetermined value or rate is identified as defective. The defective cell is removed from the inventory of cells and commonly discarded. A cell storage capacity required to temporarily hold all of the cells being produced for the 7 to 10 day or longer hold period, as well as the cost of conducting and saving the results of the cell voltage monitoring adds an undesirable cost and delay in battery cell and therefore battery pack manufacture. In addition, the above first practice and second practice of battery cell production provide very limited diagnostic or prognostic capability to identify if a defect trend is occurring or to identify if a battery cell is of superior, average or poor quality until after a substantial amount of time has passed.

The above processes produce high scrap rates of cells and do not provide for early-in-manufacture testing of cell quality. In addition, inventory retention times are high and are not reduced by establishing quality compliance earlier in the process. Cell accelerated lifecycle testing is an aging and cycling test to determine if the candidate cell of a particular lot of cells meets durability requirements based on 100 to 300 charge and discharge cycles and is delayed because quality control (QC) checks are not combined during the time-consuming formation protocol.

Thus, while current battery cell manufacturing methods achieve their intended purpose, there is a need for a new and improved system and method for manufacturing and testing battery cells for automobile vehicle battery pack production.

SUMMARY

According to several aspects, a method for identifying a cell's quality during cell formation includes: conducting a beginning of life cycling following an initial cell formation charge of multiple cells; collecting and preprocessing a discharge data set generated by one of the multiple cells during the beginning of life cycling; calculating a statistical variance from the charge and or discharge data set identifying an estimated probability of meeting a target cell usage time; and projecting a life span of the multiple cells.

In another aspect of the present disclosure, the method further includes grouping the multiple cells into a low cycle life group, a medium cycle life group and a high cycle life group based on the statistical variance.

In another aspect of the present disclosure, the method further includes applying a peak detection to identify peak locations and magnitude of the voltage derivative of formation charge, and beginning of life charge and discharge data curves, defined as dQ/dV curves.

In another aspect of the present disclosure, the method further includes identifying if a higher than predetermined threshold humidity creates a suppression or dislocation of peaks in the dQ/dV curves due to reduced ethylene production.

In another aspect of the present disclosure, the method further includes correlating multiple shape characteristics of dQ/dV of charge/discharge curves of a cell to a known high, medium and low life group of cells to predict an expected life of the cell.

In another aspect of the present disclosure, the method further includes defining a cycle of the beginning of life cycling operation to include: charging one of the multiple cells by increasing a cell voltage up to approximately 4.2 V; and discharging the one of the multiple cells to reduce the cell voltage from approximately 4.2 V down to approximately 2.7 V.

In another aspect of the present disclosure, the method further includes performing the beginning of life cycling operation of every cell for up to ten cycles.

In another aspect of the present disclosure, the method further includes calculating the statistical variance of voltage at a given level of charge from the first cycle, to up to ten subsequent cycles of the beginning of life cycling.

In another aspect of the present disclosure, the method further includes converting the charge/discharge curves to a set of features including the statistical variance, an average of cell charge and discharge values, shape parameters including skew of the cell charge and discharge values including values right or left leaning from an appropriate statistical distribution including a Gaussian distribution, calculated using a difference between either voltage or capacity of at least two of the first cycles, up to the tenth cycle.

In another aspect of the present disclosure, the method further includes applying a predetermined threshold wherein an individual variance of the statistical variance or variances above the predetermined threshold defines an out of specification cell of the multiple cells.

In another aspect of the present disclosure, the method further includes creating a cell cathode for the multiple cells having a cathode chemistry defining one of $LiNi_xMn_yCo_zO_2$ (NMC622 $x\geq0.6$, $y\leq0.2$, $z\leq0.2$), $LiMn_aFe_{(1-a)}PO_4$ (LMFP, $a>0$), and $LiMn_2O_4$ (LMO) or combinations thereof.

According to several aspects, a method to identify a cell quality during cell formation includes: conducting an initial cell formation charge of multiple cells; collecting and preprocessing a formation charge data set generated by one of the multiple cells during the formation charge; smoothing the formation charge data set to remove noise; determining a derivative dQ/dV of a cell capacity (Q) with respect to a cell formation voltage (V) for the multiple cells; and performing peak fitting for peak locations of data curves identified by the derivative determination.

In another aspect of the present disclosure, the method further includes correlating factors including an individual cell voltage, the cell capacity and a condition of individual ones of multiple additives of an electrolyte added to the cell.

In another aspect of the present disclosure, the method further includes applying different ones of the peak locations of the data curves to identify a different one of multiple conditions of individual ones of the multiple cells during cell formation charging.

In another aspect of the present disclosure, the method further includes identifying an initial cell charge occurring during formation of individual ones of the multiple cells and conducting the initial cell formation charge up to a voltage of approximately 3.95V.

In another aspect of the present disclosure, the method further includes identifying if any one of the multiple cells was exposed to a higher than predetermined threshold humidity during cell formation.

In another aspect of the present disclosure, the method further includes creating multiple bins, individual ones of the bins receiving a status of one of the multiple cells differentiated between a low cycle life group, a medium cycle life group and a high cycle life group.

In another aspect of the present disclosure, the method further includes fitting each discharge voltage profile using a cubic spline or other suitable interpolation technique to obtain a set of voltage values at specified capacities or states of charge applying a set of capacity values ($Q_i$) with increments of 4 mA-h generated between 0 and 1 A-hr (for up to 250 steps); interpolation to the capacity vs voltage data and calculating a cell voltage at each increment of Q; performing uniform sampling of the capacity allowing voltages from adjacent cycles to be compared at a particular value of calculating for each capacity, $Q_i$, a difference between a second voltage profile and a first voltage profile to provide a set $\xi$, defined as $\xi=\{V_2(Q_i)-V_1(Q_i), 1\le i\le 250\}$; and determining the statistical variance for each set $\xi$. Alternatively, a second set can be calculated in a similar fashion with Q as a function of voltage; $\xi'=\{Q_2(V_i)-Q_1(V_i), 1\le i\le 250\}$.

According to several aspects, a method for identifying a cell quality during cell formation includes: identifying cell formation data for individual ones of multiple cells during an initial formation charge event; determining cell discharge data for the individual ones of the multiple cells during a beginning of life cycle event for up to a first ten discharge events, preferably a first three discharge events, of the individual ones of the multiple cells; combining the cell formation data and the cell's beginning of life charge and or discharge data with initial accelerated lifecycle testing data and training a pattern recognition of a cell formation data set; and predicting a cell lifetime for individual ones of the multiple cells applying the cell formation data set.

In another aspect of the present disclosure, the method further includes collecting the cell discharge data using cell voltage cyclers having a precision of voltage measurement accuracy$\ge\pm0.01\%$ FSR defining$\pm5$ mV precision w/ 0-5V range.

In another aspect of the present disclosure, the method further includes binning the multiple cells into one of a first bin having cells of a good quality, a second bin having cells of a medium quality and a third bin having cells of a poor quality.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
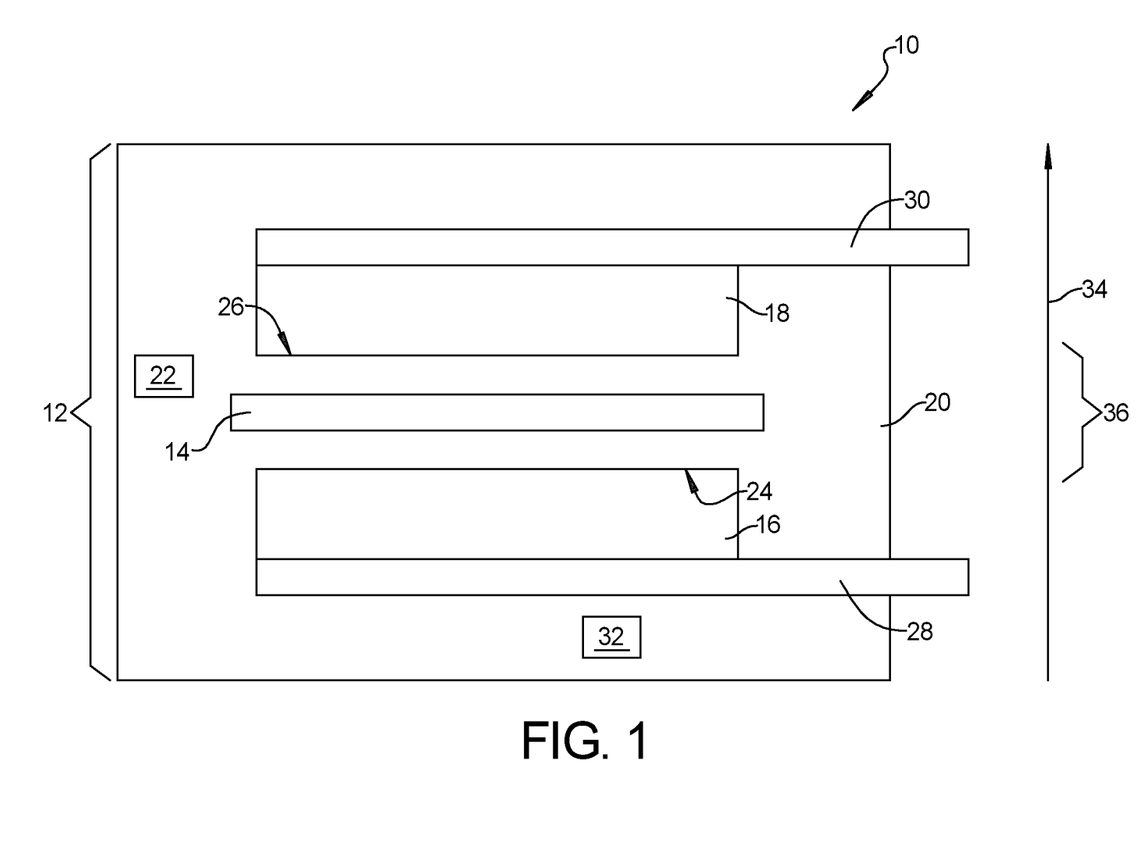
FIG. 1 is a diagram of a li-ion battery showing cell components of a cathode, anode, separator, positive current collector, and negative current collector.

Referring to FIG. 1, a system and an electrochemical (EC) method for identification of cell quality during cell formation 10 is applied during a formation cycle of an exemplary cell 12. During cell assembly a cathode/separator/anode stack is built. The initial cell assembly includes a separator 14 which may be a porous polymeric material including polypropylene or polyethylene, an anode 16 made for example of graphite and a cathode 18 made for example of an NMC622 material positioned oppositely about the separator 14 with respect to the anode 16. A stack assembly of the separator 14, the anode 16 and the cathode 18 together with electrodes described below are placed into a pouch 20. The cell 12 is initially a dry assembly of the components which is inactive until it is activated by filling the pouch 20 with an electrolyte 22. The three inner layers of the cell stack defining the anode 16, the separator 14 and the cathode 18 are porous and a cell "wetting process" occurs after electrolyte filling which fills these electrolyte 22 pores with the electrolyte 22. The cell 12 is confirmed to be active when the cell 12 achieves a cell activation charge having an open circuit voltage ranging between approximately 0.1 VDC up to approximately 2.0 VDC. A time to achieve the cell activation charge may take approximately two days and during this period data is collected and is analyzed to obtain diagnostic data which is useful to identify cell quality as discussed below.

Following confirmation of the cell activation charge an initial cell formation charge to approximately 3.95 V is applied to the cells. During the wetting period following the cell formation charge a charge infiltration of the electrolyte 22 occurs and a first solid electrolyte interphase (SEI) 24 is formed in situ on a surface of the anode 16 by the reduction of electrolyte solvents, additives and salts at an anode 16 outer surface. Also during the wetting period a second solid electrolyte interphase (SEI) 26 is formed in situ on an outer surface of the cathode 18 by the oxidation of electrolyte solvents, additives and salts at a cathode 18 surface.

An anode current collector 28 made of copper for example is attached to anode active material of the anode 16 and extends outwardly from the pouch 20. A cathode current collector 30 made of aluminum for example is attached to cathode active material of the cathode 18 and extends outwardly from the pouch 20. The electrolyte 22 and any contaminant reduction generates varying electrochemical responses. Formation of the first SEI 24 and the second SEI 26 are completed by the reduction of the electrolyte 22 defining the multiple electrolyte solvents, additives, and salts, all of which happen at specific voltages. The reduction of the electrolyte 22 is accompanied by off-gassing of multiple formation gasses 32 and the formation gasses 32 may be collected in a separate area of the pouch 20 and are vented from the pouch 20.

"Wetting" is defined as electrolyte infiltration of the separator 14, the active materials of the anode 16 and the active materials of the cathode 18. Ions migrate spontaneously due to a voltage difference or if a current is applied from the cathode 18 to the anode 16 and from the anode 16 to the cathode 18 can take up to approximately two days. It has been determined that inflections of response curves of individual electrochemical responses after introduction of the electrolyte 22 and then at beginning of formation charging are proportional to an amount of decomposition occurring in a specific voltage range.

Typical active materials used in lithium-ion batteries are:
Cathode: $LiNi_xMn_yCo_zO_2$ (NMC622 $x \geq 0.6$, $y \leq 0.2$, $z \leq 0.2$),
$LiMn_aFe_{(1-a)}PO_4$ (LMFP, $a>0$), $LiMn_2O_4$(LMO), or a blend
Anode: Li-ion: anode is graphite: SiOx, Si or a blend
Li metal: anode is Li metal
Gases formed during SEI formation include:
$C_2H_4$, CO, $H_2$, $CH_4$, $C_2H_6$, butanes, etc.

Referring to FIG. 2 and again to FIG. 1, a formation charge graph 38 for cells 12 provides a charge curve 40 for an exemplary measured voltage 42 compared to a measured cell capacity (Ah) 44 over time. The charge curve 40 is initially substantially vertical until an inflection area 46 is reached. Data collected from charge curve 40 and in particular from the inflection area 46 is analyzed to identify a quality level of individual ones of the cells 12, which is described in greater detail in reference to FIGS. 3 through 5.

Figure 2:
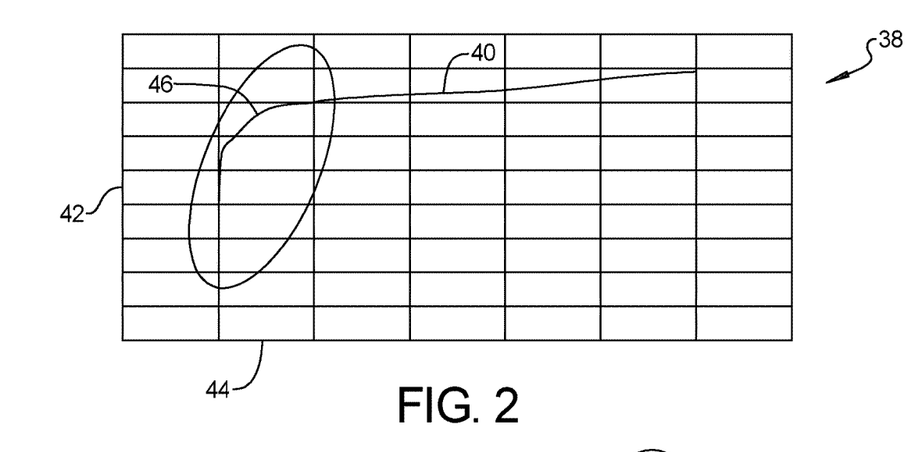
FIG. 2 is a graph presenting formation charge data for the cell of FIG. 1.

Referring to FIG. 3 and again to FIG. 2, using an exemplary cell chemistry for the cell 12 of NCM622/graphite, a graph 48 presents a method for analyzing a formation charge, by comparing a derivative dQ/dV of a cell capacity (Q) with respect to a cell formation voltage (V) identified on a first axis 50 to the formation voltage (V) on a second axis 52. A first curve 54 presents a cell formation with no additives in the electrolyte 22 described in reference to FIG. 1. This cell presents substantially no response until a voltage spike occurs at approximately 2.9 volts. A cell with this response provides a lowest expected life span and may be deemed unacceptable. A second curve 56 presents a cell formation with good additives in the electrolyte 22. A cell with this response is anticipated to provide the greatest or high cell quality and longest life. A third curve 58 presents a cell formation with aged additives in the electrolyte 22. A cell with this response is anticipated to provide a medium cell quality and a medium life span. A fourth curve 60 presents a cell formation occurring with exposure of the cell to elevated ambient humidity which is above a predetermined humidity. A cell with this response is anticipated to provide a low cell quality and a medium to low cell life span. From the above, it is noted that the shape of the formation charge curves may be related to multiple factors including the condition of the additives and the presence of elevated humidity and is correlated to a projected life of the cell.

Figure 3:
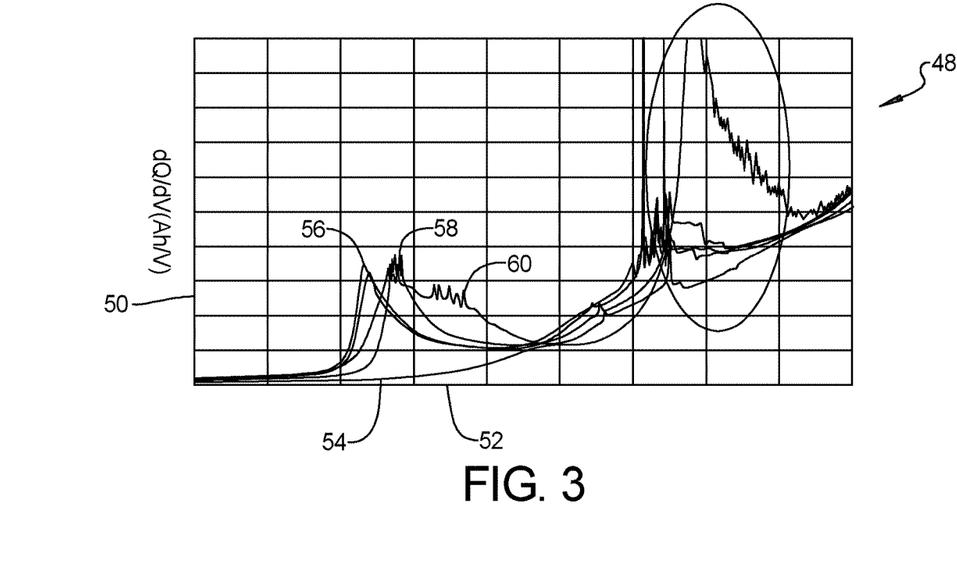
FIG. 3 is a graph of the derivative of capacity with respect to voltage dQ/dV for the formation charge curve shown in FIG. 2.

The data presented in FIG. 3 allow cells to be identified early in cell formation and prior to accelerated lifecycle testing which exhibit high, medium and low cell quality. This cell quality pattern recognition permits the cells to be binned after initial formation into high, medium and low quality groups. Binning may be conducted by assigning different cell quality designations to individual cells. As subsequent battery pack assembly can benefit from use of battery cells all having similar cell quality, the data in FIG. 3 allows battery pack formation of the highest overall quality and longest potential life span.

Referring to FIG. 4 and again to FIGS. 2 and 3, a graph 62 presents cell formation data in a different form, having a first axis 64 defining a voltage and a second axis 66 defining a log of the cell capacity (Ah). A divergent area 68 identifies when cell formation data curves diverge. A first curve 70 defines a cell formation having no additives to the electrolyte. A second curve 72 defines a cell formation occurring in dry (low humidity) conditions with properly performing additives. A third curve 74 defines a cell formation occurring in most above predetermined threshold humidity conditions.

Figure 4:
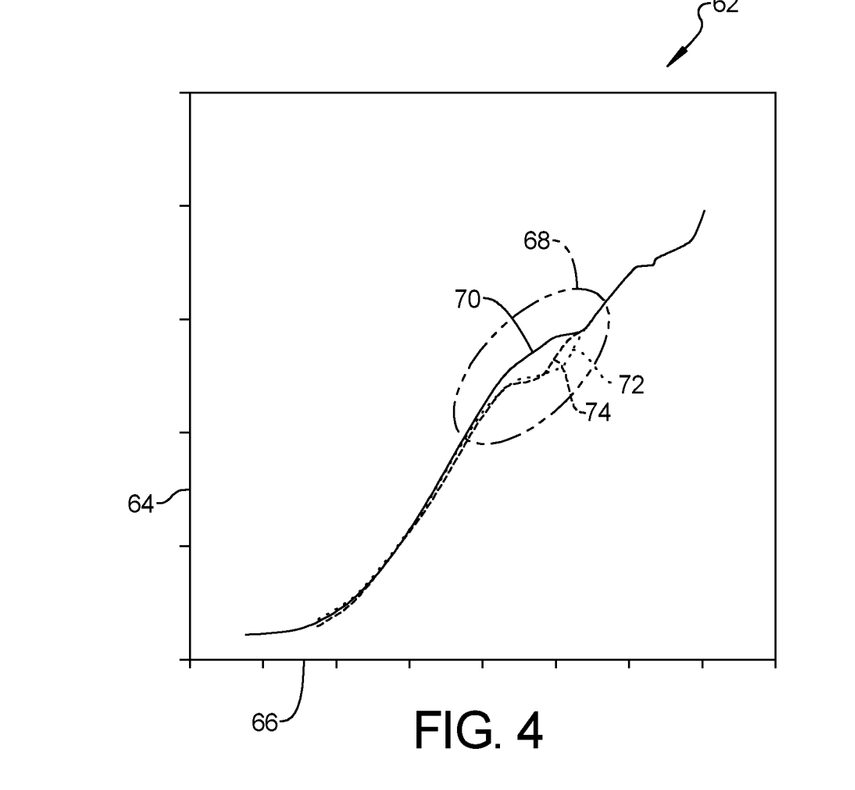
FIG. 4 is a graph presenting the formation charge data for the cell of FIG. 1 with respect to the log of capacity.
Figure 5:
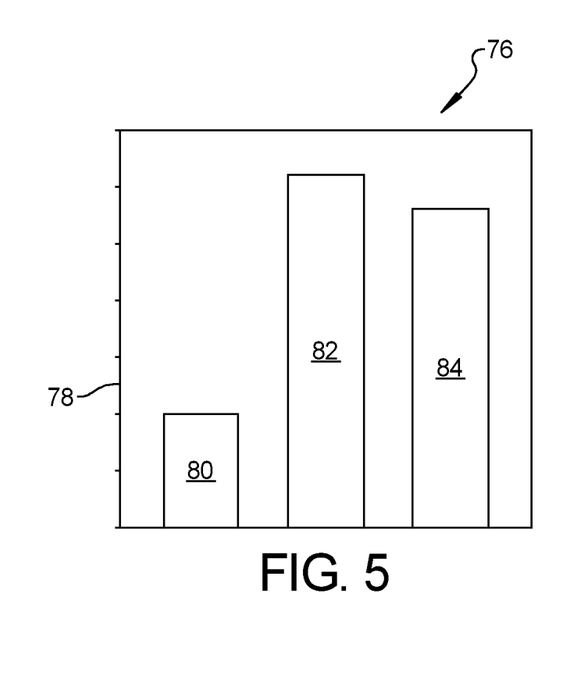
FIG. 5 is a bar chart presenting residual capacities of different cells after 500 cycles of accelerated aging or lifecycle testing, with different manufacturing defects and grouping of cells according to an exemplary aspect.

Referring to FIG. 5 and again to FIGS. 1 through 4, a bar chart 76 presents a residual capacity (%) after accelerated lifecycle testing for 500 cycles for the three cells of FIG. 4 to allow distinguishing acceptable from defective cells. A first bar 80 presents the cell defined by the first curve 70 of FIG. 4, which designates a cell having a residual capacity of approximately 70% identified as a defective cell. A second bar 82 presents the cell defined by the second curve 72 of FIG. 4, which designates a cell having a residual capacity of approximately 92% identified as a high quality cell. A third bar 84 presents the cell defined by the third curve 74 of FIG. 4, which designates a cell having a residual capacity of approximately 87% identified as an acceptable medium quality cell. From the above, it is noted a variance of the discharge curves which may be related to multiple factors including cell voltage, humidity of the cell during formation and cell capacity is correlated to a projected life of the cell.

Pattern recognition of formation cycle data is combined with limited accelerated lifecycle testing to create learning feedback so that a time window to conduct the accelerated lifecycle testing can be reduced or eliminated entirely. Feedback identified during the cell formation cycle has been identified to provide for more timely corrective action during cell fabrication. Definitive quality checks earlier in the manufacturing process reduce the need for cell and pack storage to conduct voltage droop testing. Data rich processing monitoring improves cell quality and is cost effective when done during the assembly's rate limiting step. Data processing using advanced analytics is used to generate and monitor key features of the electrochemical signature.

$$s^2 = \frac{\sum (x - \bar{x})^2}{n - 1} \qquad \text{Equation 1}$$

Where:
$s^2$=sample variance
$x=x_i$=value of $i^{th}$ element, i=1, . . . , n
xbar=sample mean
n=sample size It has been found that by calculating a statistical variance S using equation 1 above from the first 3 (three) cycles allows for provision of an estimated probability of meeting target usage time, allowing the cells to be grouped into low, medium and high projected cycle life, thereby reducing reliance on accelerated lifecycle testing. For example, in a first step each discharge voltage profile is fit using a cubic spline interpolation to obtain a set of voltage values at specified capacities or states of charge. To do this a set of capacity values ($Q_i$) with increments of 4 mAh is generated between 0 and 1 Ah (250 steps) and then a cubic spline fit to the experimental capacity vs voltage data is used to calculate the corresponding voltages at each increment of Q. Uniform sampling of the capacity allows voltages from adjacent cycles to be compared at a particular value of $Q_i$. For each capacity, $Q_i$, a difference between a second voltage profile and a first voltage profile is calculated to provide a set $\xi$, defined as $\xi=\{V_2(Q_i)-V_1(Q_i), 1\leq i\leq 250\}$, which may be abbreviated as $\Delta V_{2-1}$. For each set $\xi$, the variance is taken, which is described by equation 1. Alternatively, a second set, $\xi$, can be calculated in a similar fashion with Q as a function of voltage; $\xi'=\{Q_2(V_i)-Q_1(V_i), 1\leq i\leq 250\}$.

Figure 6:
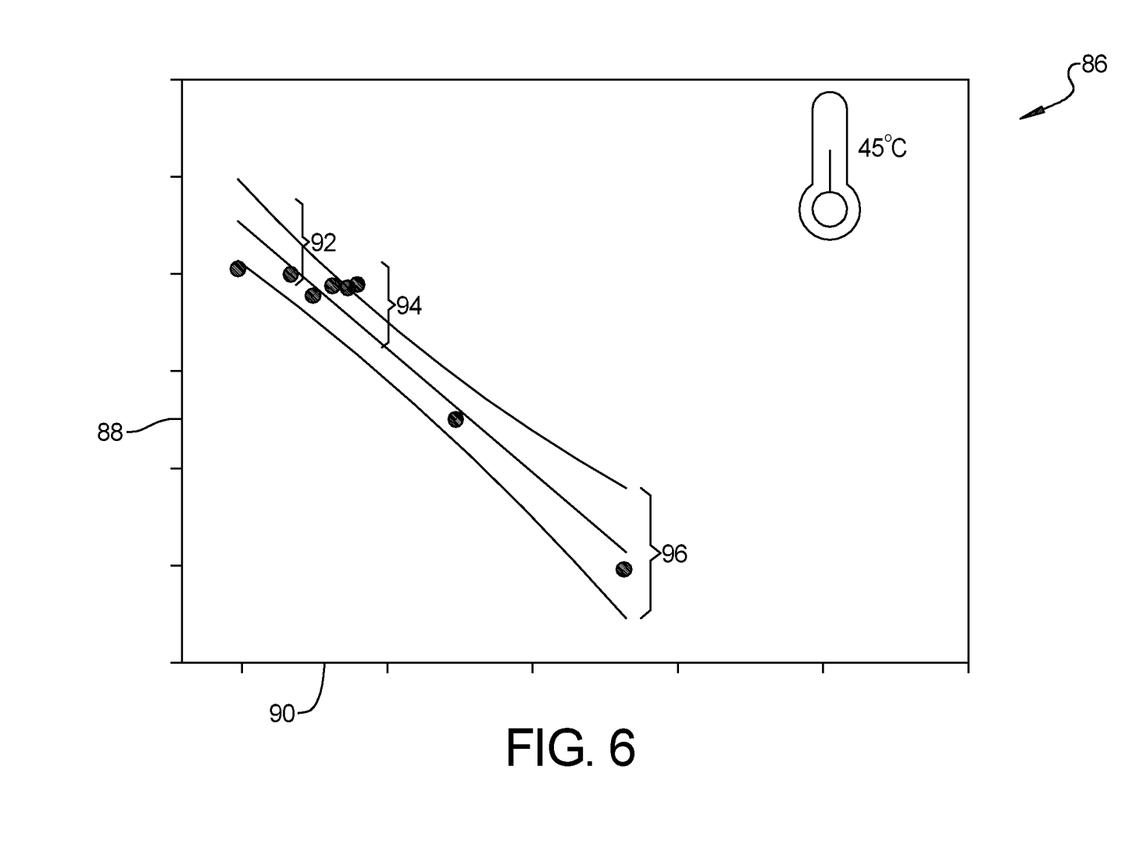
FIG. 6 is a graph presenting cell residual capacity versus a log of a variance of beginning of life discharge capacity vs voltage curves of the cell capacity for cells produced according to an exemplary aspect.

Referring to FIG. 6 and again to FIGS. 1 through 5, by calculating a statistical variance using Equation 1 above for the first 3 (three) cycles of cell operation a probability of meeting a target usage time may be estimated. Using this variance, a cell grouping may be obtained, divided into low, medium and high cycle life or quality. FIG. 6 presents a graph 86 having as a first axis 88 a residual cell capacity at 500 cycles (%). A second axis 90 defines a log of the calculated variance. Cells presenting in a first zone 92 may be defined as cells having a high cycle life. Cells presenting in a second zone 94 may be defined as cells having a medium cycle life. Cells presenting in a third zone 96 may be defined as cells having a low cycle life. From the above, it is noted a variance of the discharge curves which may be related to multiple factors including cell capacity and a variance of cell capacity is correlated to a projected life of the cell.

Data collected during the cell formation stage is automatically preprocessed using noise filtering to smooth the data. The data is then transformed, for example using a first or higher derivative, such as dQ/dV as described in reference to FIG. 3. Features are then identified using peak detection to identify peak locations and intensities.

Figure 7:
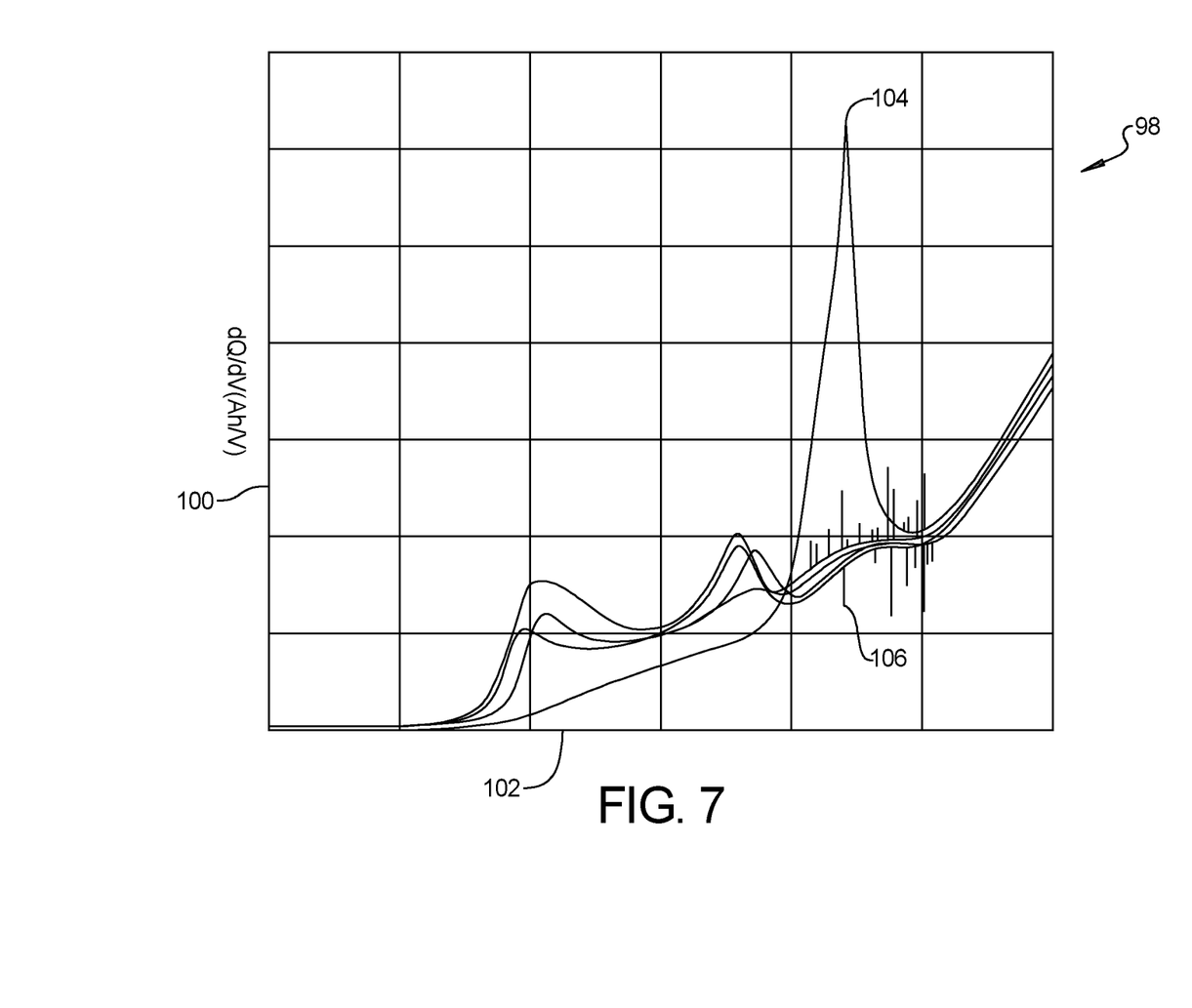
FIG. 7 is a graph presenting formation charge dQ/dV of cells having different formation conditions.

Referring to FIG. 7 and again to FIGS. 2 through 6, a graph 98 presents data corresponding to a derivative (dQ/dV) of cell capacity (Q) with respect to a cell formation voltage (V) identified on a first axis 100, to the formation voltage (V) on a second axis 102. Peaks in the data correspond to a reduction of the solvent, salt or additives of the electrolyte 22. For example, a large peak 104 in dQ/dV corresponds to a lack of additives in the electrolyte 22. A presence of moisture creates a suppression of the EC peak 106 due, for example, to reduced ethylene production in cells exposed to moisture during formation. The presence of increasing moisture results in a proportional increase in the intensity of a reduction feature and a suppression of EC reduction. These deviations can be linked to the concentrations of the formation gas and taken in combination may be used to determine a root cause of the defect.

Figure 8:
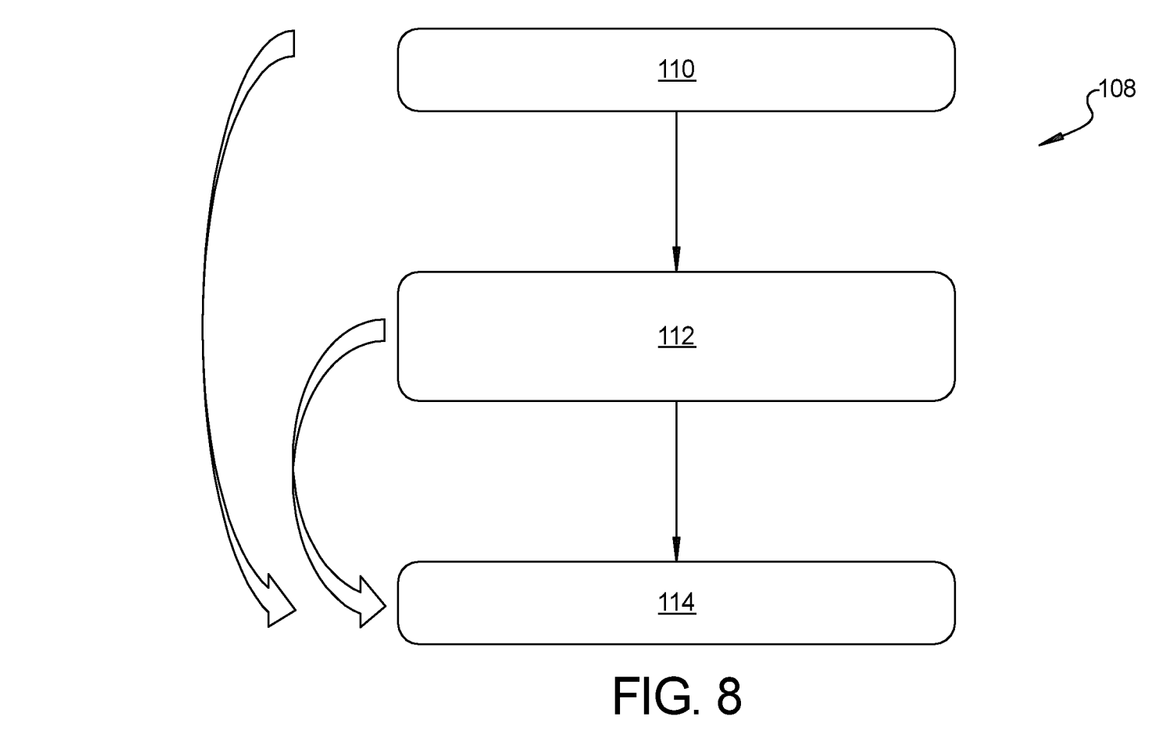
FIG. 8 is a flow diagram of an automated flow process forming cells of the present disclosure.

Referring to FIG. 8 and again to FIGS. 2 through 7, an exemplary automatic or automated process flow diagram 108 includes as an initial or first step 110 identifying an initial cell charge occurring during cell formation. The data of FIGS. 2 through 4 may be used for this purpose. In a second step 112, during cell formation a beginning of life cycling is conducted as described in reference to FIG. 6.

Data during formation charging is collected and preprocessed using noise filtering to smooth the data. The data is then transformed using a derivative such as dQ/dV as described in reference to FIGS. 3 and 7. Features are identified such as by application of a peak detection to identify peak locations and intensities as shown and described in reference to FIG. 6. In a third step 114, an inventory hold and an initial accelerated lifecycle testing may be conducted if warranted, depending on results from the first step 110 and the second step 112.

Referring to FIG. 9 and again to FIGS. 2 through 8, an exemplary system flow diagram 116 identifies features of the system and an electrochemical method for identification of cell quality during cell formation 10. The following processes or steps are automated. A server computer 118 collects all system data from a repository 120 and makes final cell quality decisions including if a cell is of a high quality 122, a medium quality 124 or a low quality 126, and further identifies cells which are unacceptable or of poor quality. The repository 120 receives all sensor data and decisions from an edge computer 128. The server computer 118 also provides communication of new system "rules" and communicates these to the edge computer 128. The edge computer 128 which may be a single or multiple computers provides for sensing and single station monitoring. The edge computer 128 is connected to at least one sensor for the individual cells being prepared. The server computer 118, the repository 120, and the edge computer 128 belong to the same network. Each computer includes one or more processors, a memory, and instructions stored in the memory. The memory is a non-transitory computer-readable medium.

Figure 9:
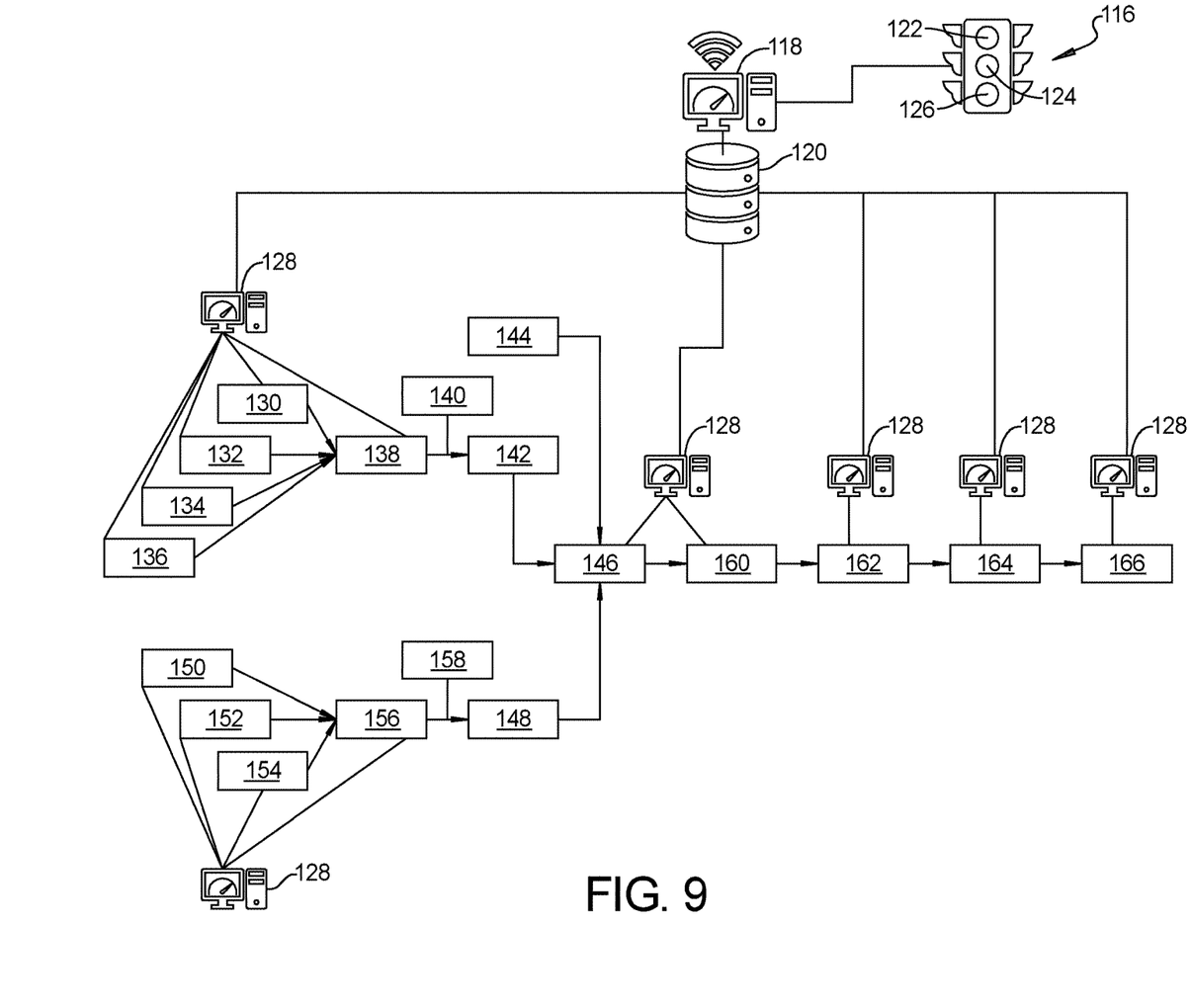
FIG. 9 is flow diagram of an overall process for preparing cells of the present disclosure.

Multiple items including a solvent 130, a binder 132, an active material 134, and carbon black 136 are combined to create a first slurry 138. The first slurry 138 may be combined with aluminum 140 to create a cathode 142 similar to the cathode 18 described above. The edge computer 128 monitors the components forming the cathode 142 and the conditions such as ambient temperature and humidity under which cathode 142 is formed. The cathode 142 and a separator 144 are combined to partially form a cell assembly 146, together with an anode 148, which is similar to the anode 16 described above whose assembly is further defined as follows. Multiple items including a solvent 150, a binder 152 and an active material 154 are combined to create a second slurry 156. Copper 158 may also be combined with the second slurry 156 to create the anode 148 similar to the anode 16 described above. The edge computer 128 monitors the components forming the anode 148, and the conditions such as ambient temperature and humidity under which cathode 148 is formed.

After the cell assembly 146 is assembled, the electrolyte 22 is added and a wetting process 160 is conducted, which is monitored by the edge computer 128. A cell formation process 162 follows the wetting process 160, which is independently monitored by the edge computer 128. A degas process 164 follows the cell formation process 162, which is independently monitored by the edge computer 128. Finally, a beginning of life cycling process 166 is conducted following completion of the degas process 164, which is also independently monitored by the edge computer 128.

The moment in time for every step in the process above is recorded by the edge computer 128 and communicated to server 118.

Figure 10:
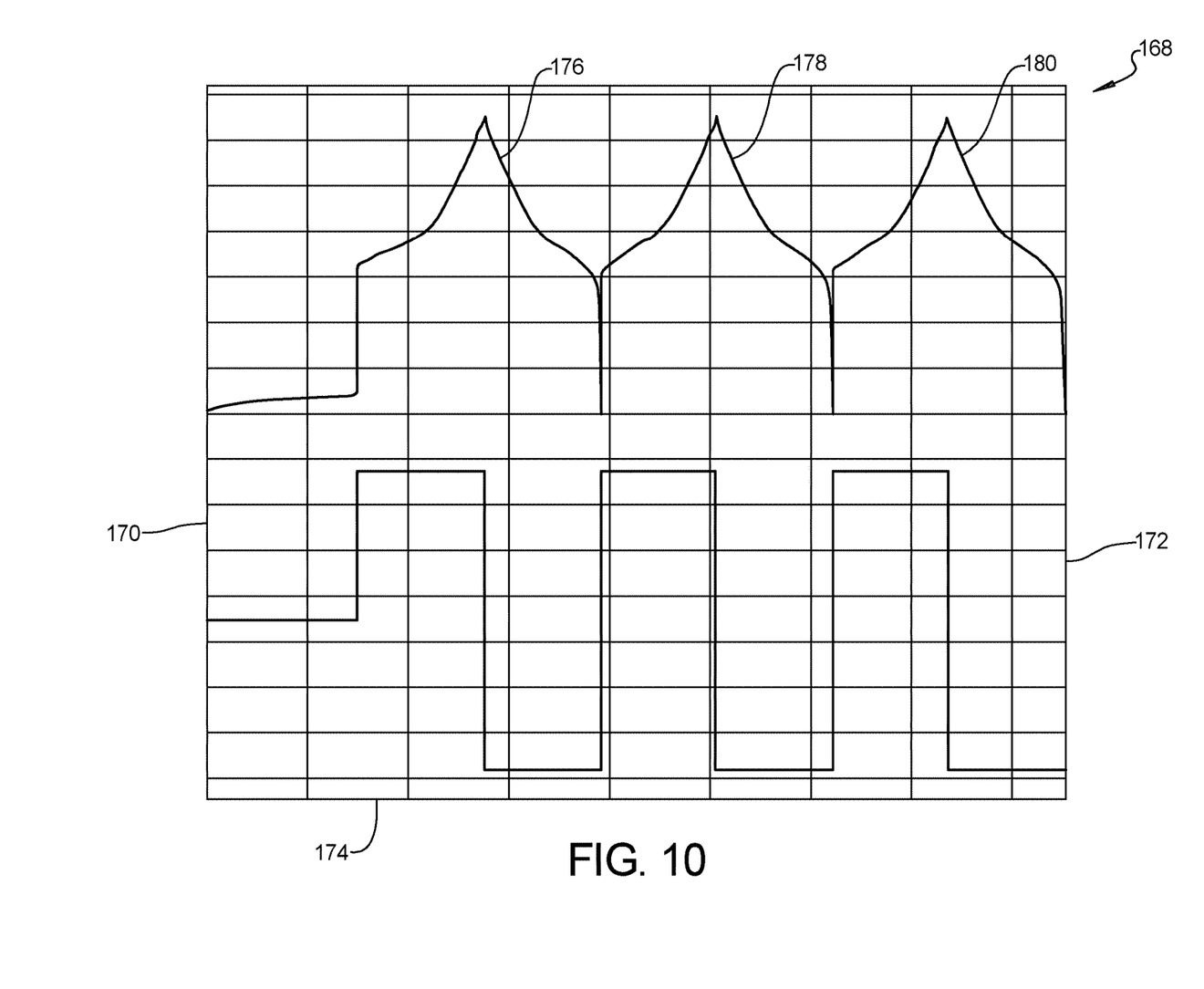
FIG. 10 is a diagram detailing the voltage versus time (top) and the current versus time for a cell's initial formation charge and three beginning of life charge/discharge cycles.

Referring to FIG. 10, a graph 168 presents cell discharge data for a cell voltage 170 compared to a cell current 172 in mA to a time 174 in hours for successive discharge events for a single cell of the present application during beginning of life cycling testing. Initially discharge data is collected for 3 beginning of life charge/discharge cycles, 176, 178, 180. Each cycle's data is fit with a cubic spline or similar fit and a capacity is aligned by interpolation. A change in voltage between each two cycles, for example given as $\Delta V_{2-1}$ is then calculated. A statistical variance is then calculated for $\Delta V_{2-1}$ using equation 1 above. The calculated statistical variance is then related to accelerated lot acceptance tests previously performed.

Subtle electrochemical responses of a cell during the formative charge cycle reveal cell quality issues. Pattern recognition applied through data analytics and machine learning is used to recognize the quality issues, allowing defective cells to be identified earlier in the manufacturing process prior to accelerated lifecycle testing and further allowing good cells to be identified and binned into low, medium and high quality classes.

To collect cell voltage discharge data cyclers may be used having a precision of voltage measurement accuracy ±0.01% full scale range (FSR) (eg. ±5 mV precision with 0-5V range). These lower precision cyclers are less expensive than currently known high precision cyclers having a current measurement accuracy $\geq \pm 0.02\%$ FSR (eg ±10 mA w/ 0-0.5 A range), and a current control resolution of 0.0003% FSR.

In another aspect of the present disclosure, the method further includes converting the charge/discharge curves to a set of features comprising the statistical variance, an average of cell charge and discharge values, shape parameters (e.g. skew) of the cell charge/discharge values including values right or left leaning from an appropriate statistical distribution, e.g. Gaussian distribution, calculated using difference between either voltage or capacity of at least two of the first cycles, up to the tenth cycle.

A system and an electrochemical method for identification of cell quality during cell formation 10 of the present disclosure offers several advantages. These include a method which uses cell electrochemical signatures combined with data analytics and machine learning to identify possible quality issues in cells during the formation cycle of manufacture. Using the data from the formation and beginning of life cycles combined with initial accelerated cycle test and using the feedback from these tests to train a pattern recognition algorithm of the formation response may lead to a tapered extinction of accelerated cycling test and provides manufacturing process feedback early in the cell manufacturing process.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A method to identify a cell quality during cell formation, comprising:
   conducting an initial cell formation charge of multiple cells;
   collecting and preprocessing a formation charge data set generated by one of the multiple cells during the formation charge for each of the multiple cells, the formation charge data set including a measured cell capacity (Q) and a measured cell formation voltage (V) of the multiple cells measured during a wetting process of the multiple cells;
   smoothing the formation charge data set to remove noise;
   determining a data curve for each of the multiple cells, the data curve comprising a derivative dQ/dV of the measured cell capacity (Q) with respect to the measured cell formation voltage (V) for the multiple cells;
   identifying peak locations in the data curves identified by the derivative;
   fitting a discharge voltage profile using a cubic spline to obtain a set of voltage values at specified capacities or states of charge applying a set of capacity values ($Q_i$) with increments of 4 mA-h generated between 0 and 1 Ah (for up to 250 steps), fitting a cubic spline to the capacity vs voltage data and calculating a cell voltage at each increment of Q; performing uniform sampling of the capacity allowing voltages from adjacent cycles to be compared at a particular value of $Q_i$, calculating for each capacity, $Q_i$ a difference between a second voltage profile and a first voltage profile to provide one of a first set $\xi$, defined as $\xi = \{V_2(Q_i) - V_1(Q_i), 1 \leq i \leq n\}$, determining a statistical variance for each set $\xi$, and estimating a probability of meeting a target usage time based on the statistical variance;
   determining a residual cell capacity of each of the multiple cells based on the identified peak locations and the probability of meeting the target usage time;
   binning each one of the multiple cells based on the residual cell capacity into one of a first bin, a second bin, and a third bin, wherein the first bin includes any of the multiple cells having a first residual cell capacity, the second bin includes any of the multiple cells having a second residual cell capacity, and the third bin includes any of the multiple cells having a third residual cell capacity, and wherein the third residual cell capacity is greater than the second residual cell capacity which is greater than the first residual cell capacity; and
   assembling a battery pack from the multiple cells, wherein the battery pack is comprised of multiple cells entirely from the first bin, entirely from the second bin, or entirely from the third bin.

2. The method of claim 1, further including creating a cell cathode for the multiple cells having a cathode chemistry defining one of $LiNi_xMn_yCo_zO_2$ (NMC622 x=0.6, y=0.2, z=0.2), $LiMn_aFe_{(1-a)}PO_4$ (LMFP, a>0), $LiMn_2O_4$ (LMO) or combinations thereof.

3. The method of claim 2, further including creating a cell anode of a graphite material for the multiple cells having an anode chemistry defining one of SiOx, or Si.

4. The method of claim 1, further including correlating factors including an individual cell voltage, the residual cell capacity and a condition of individual ones of multiple additives of an electrolyte added to the cell.

5. The method of claim 1, further including applying different ones of the peak locations of the data curves to identify a different one of multiple conditions of individual ones of the multiple cells during cell formation charging.

6. The method of claim 1, further including identifying an initial cell charge occurring during formation of individual ones of the multiple cells and conducting the initial cell formation charge up to a voltage of approximately 3.9V.

7. The method of claim 1, further including identifying if any one of the multiple cells was exposed to a higher than predetermined threshold humidity during cell formation.

* * * * *